(12) United States Patent  (10) Patent No.: US 7,855,097 B2
Dimmler                    (45) Date of Patent:    Dec. 21, 2010

(54) METHOD OF INCREASING YIELD IN OFETS BY USING A HIGH-K DIELECTRIC LAYER IN A DUAL DIELECTRIC LAYER

(75) Inventor: Klaus Dimmler, Colorado Springs, CO (US)

(73) Assignee: OrganicID, Inc., Colorado Springs, CO (US)

( * ) Notice: Subject to any disclaimer, the term of this patent is extended or adjusted under 35 U.S.C. 154(b) by 216 days.

(21) Appl. No.: 12/172,025

(22) Filed: Jul. 11, 2008

(65) Prior Publication Data
US 2010/0006826 A1    Jan. 14, 2010

(51) Int. Cl.
*H01L 51/40* (2006.01)

(52) U.S. Cl. .................. 438/99; 438/149; 438/150; 438/151; 438/E21.272; 257/40

(58) Field of Classification Search .................. 438/99, 438/149–151; 257/40
See application file for complete search history.

(56) References Cited

U.S. PATENT DOCUMENTS

| 7,364,940 | B2* | 4/2008 | Kim et al. ................... 438/99 |
| 2006/0086936 | A1 | 4/2006 | Hoffman et al. |
| 2007/0018163 | A1 | 1/2007 | Chian et al. |
| 2007/0134857 | A1* | 6/2007 | Suh et al. ................... 438/149 |
| 2007/0215957 | A1* | 9/2007 | Chen et al. ................... 257/411 |
| 2008/0001151 | A1 | 1/2008 | Jun et al. |

* cited by examiner

*Primary Examiner*—Dung A. Le
(74) *Attorney, Agent, or Firm*—Christensen O'Connor; Johnson Kindness PLLC

(57) ABSTRACT

Dielectric layer pinholes in OFET structures are addressed in a method of fabricating OFET devices through the addition of a high-K dielectric layer to eliminate the effects of shorts in the dielectric layer. The original dielectric layer is maintained such that the semiconductor/dielectric interface remains unchanged. The high-K dielectric layer contributes material to the gate dielectric to plug up pinholes in the original dielectric, but does not contribute significant capacitance due to the high dielectric constant of the additional dielectric layer. The incidence of pinholes in the dielectric layer is reduced without significantly affecting the performance of the OFET transistor.

10 Claims, 8 Drawing Sheets

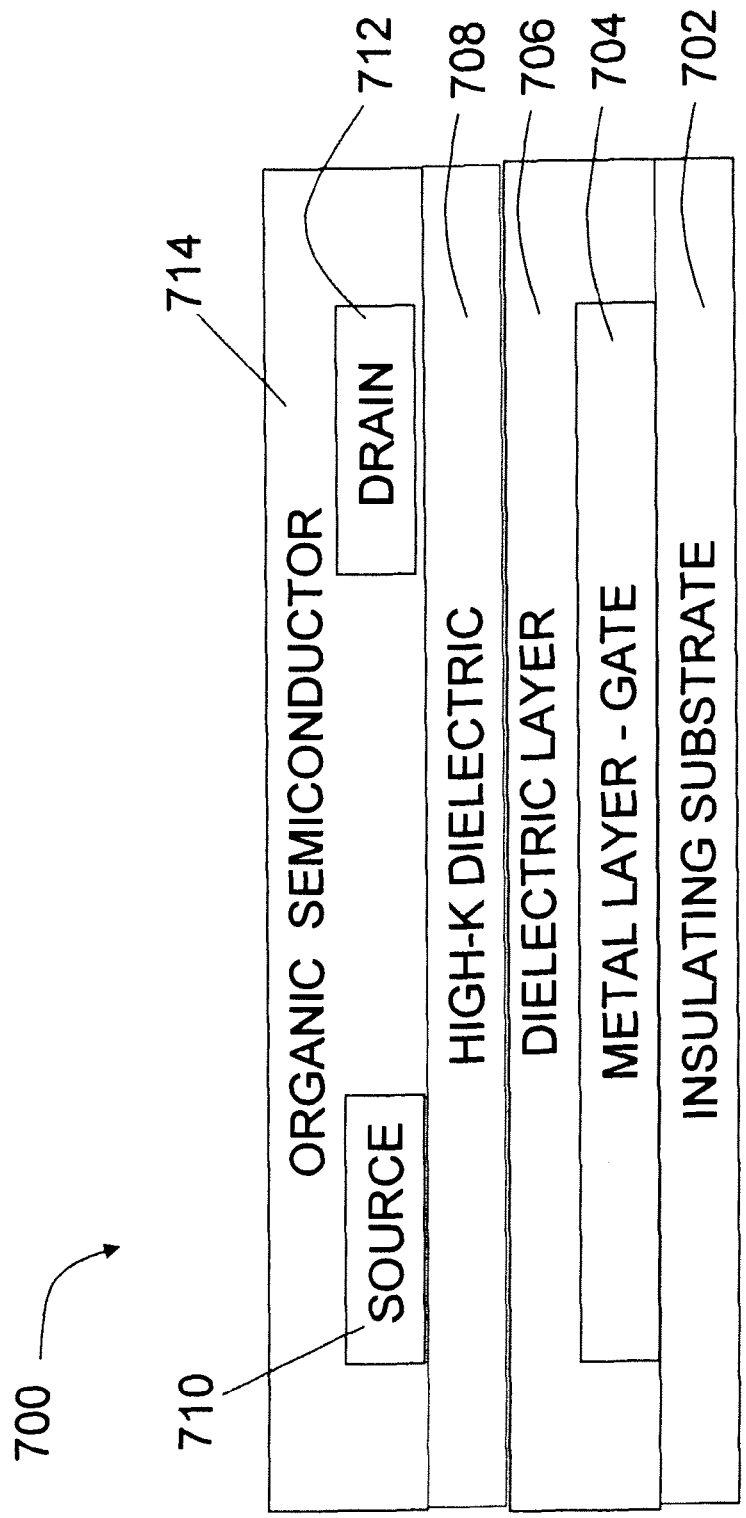
Figure 7: Bottom Gate/ Bottom Contact Structure with high-K dielectric

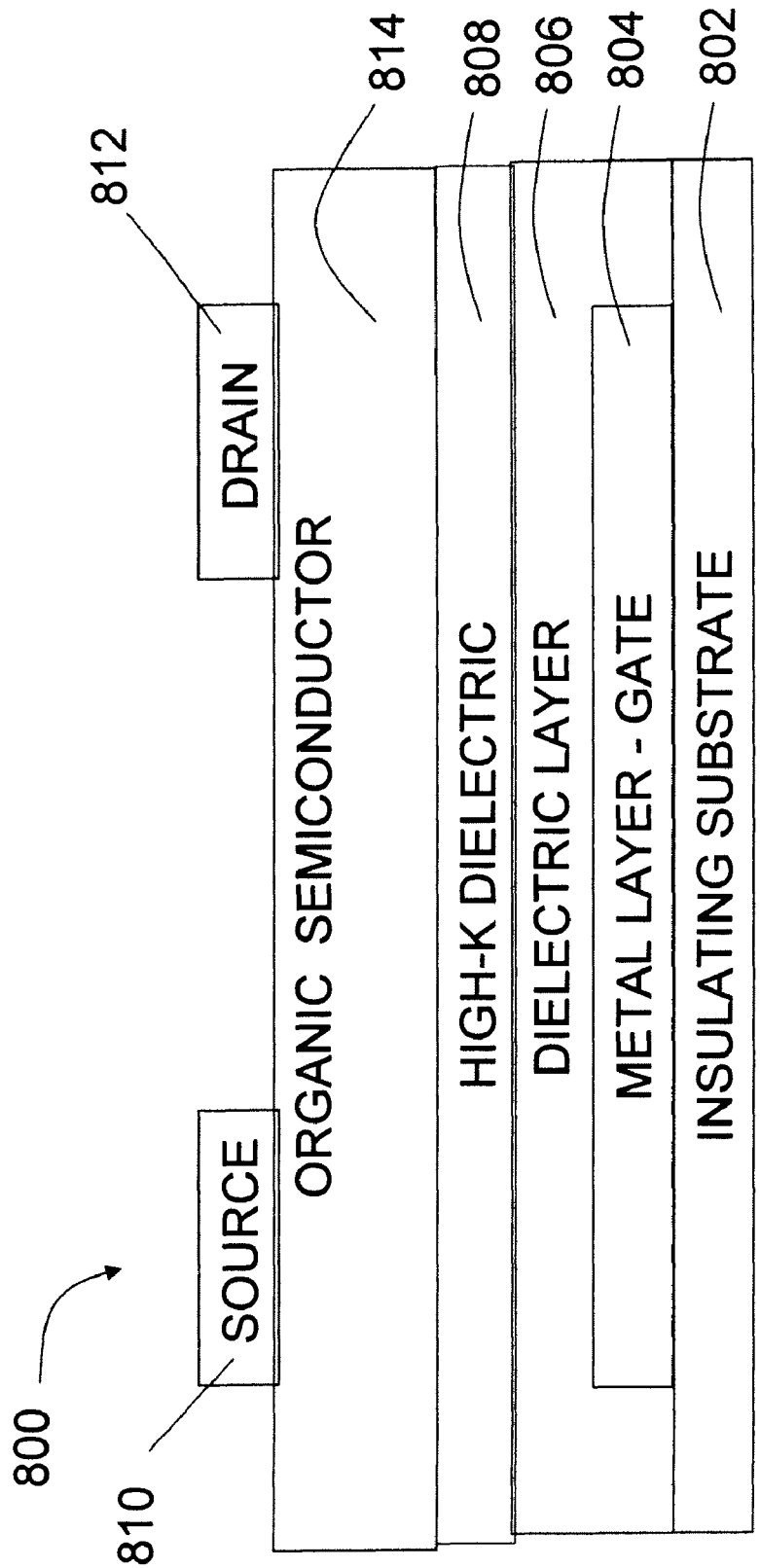
Figure 8: Bottom Gate/ Bottom Contact Structure with high-K dielectric

METHOD OF INCREASING YIELD IN OFETS BY USING A HIGH-K DIELECTRIC LAYER IN A DUAL DIELECTRIC LAYER

FIELD OF THE INVENTION

The present invention relates to Organic FETs ("OFETs"), and, more particularly, to the use of a second, high-K dielectric layer in addition to a first, low-K dielectric layer in an OFET structure to improve reliability and yield without adversely affecting performance.

BACKGROUND OF THE INVENTION

The performance of an OFET structure is generally improved when the capacitance between the gate and the channel increases. This can be achieved by making the dielectric layer between the gate and channel as thin as possible. However, as the dielectric layer is made thinner, there is an increased probability of shorting between the first conductor source/drain layer and the second conductor gate layer caused by an increased likelihood of pinholes in the thinner dielectric.

Such pinholes are particularly prevalent in polymer dielectric layers and will inadvertently permit shorting of a first layer conductor to a second layer conductor in the OFET. In the prior art, the dielectric layer can be increased in thickness or deposited a second time in order to reduce incidences of these pinholes. However, both of these approaches undesirably result in a thicker gate dielectric layer, significantly decreasing the performance of the transistor. In the prior art, dielectric layer might alternatively be replaced with a high-K dielectric layer. When the dielectric constant of the dielectric layer is increased, a comparable gate capacitance is achieved with a thicker dielectric layer. However, dielectric compatibility with the organic semiconductor is crucial in OFET devices. High-performing organic semiconductors tend to be compatible only with low-K dielectrics.

What is desired, therefore, is an OFET-compatible fabrication method and corresponding OFET structure for reducing the probability of pinholes without significantly changing the capacitance between gate and channel.

BRIEF DESCRIPTION OF THE DRAWINGS

The foregoing and other objects, features and advantages of the invention will become more readily apparent from the following detailed description of preferred embodiments of the invention, which proceed with reference to the accompanying drawings, wherein:

FIG. 7 is a cross-sectional diagram of a bottom gate/bottom contact OFET structure having a dual dielectric layer according to the present invention; and FIG. 8 is a cross-sectional diagram of a bottom gate/top contact structure having a dual dielectric layer according to the present invention.

DETAILED DESCRIPTION

Figure 1:
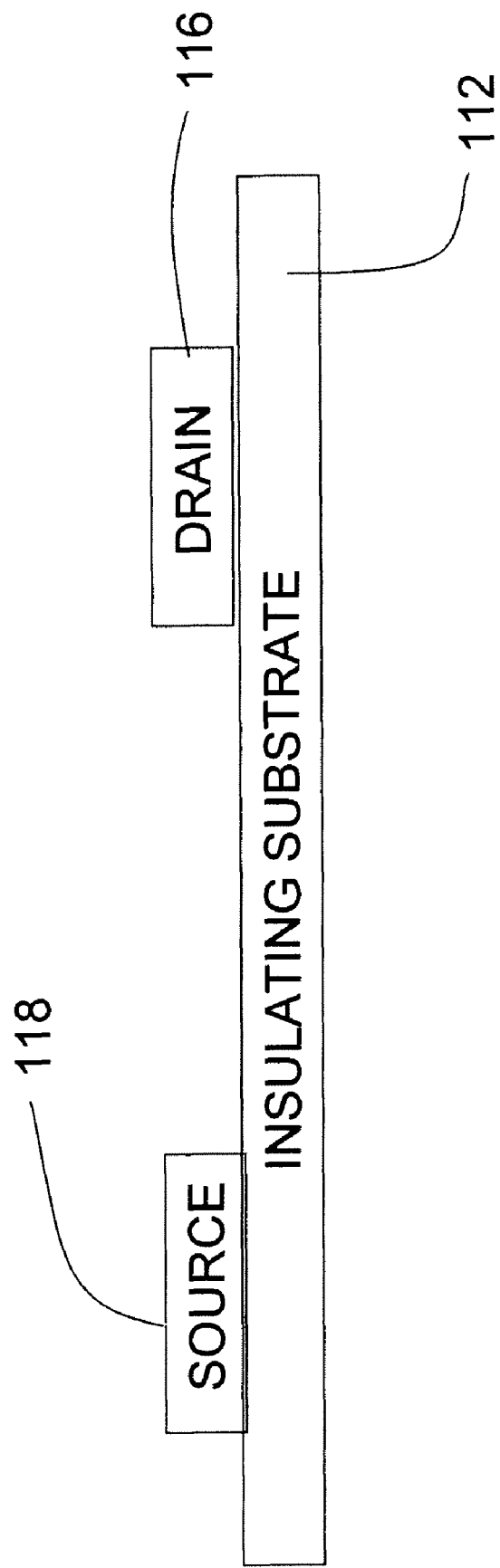
FIGS. 1-6 are sequential cross-sectional diagrams of a top gate OFET structure having a dual dielectric layer according to the present invention.

According to the present invention, an OFET fabrication method provides a solution to the pinhole problem discussed above by depositing a second layer on top of the original dielectric layer, wherein the second dielectric layer has a significantly higher dielectric constant than that of the original dielectric constant layer. A dielectric layer with a high dielectric constant is referred to as a "high-K dielectric layer". Electrically, the dual dielectric structure of the present invention can be thought of as a high-K dielectric capacitor in series with a low-K dielectric capacitor. In such a circuit configuration, the contribution of the high-K dielectric capacitor to the overall capacitance of the dual structure is minimal. Therefore, though the overall thickness of the dual dielectric structure is increased, the capacitance remains substantially unchanged. Consequently, pinhole density and the probability of shorts is decreased while not adversely affecting the performance of the dual-gate dielectric device.

High-K materials generally have high leakage, which make them unsuitable as a gate dielectric layer in an OFET structure. However, in the proposed structure according to the present invention, the low-K dielectric capacitance is in series with the high-K dielectric capacitance. Therefore, the overall leakage current is dominated by the original low-K dielectric layer. The high leakage current associated with the high-K materials will therefore not play a significant role in determining the total amount of leakage current.

High-K materials also tend to have a poor semiconductor/dielectric interface, producing poor OFET characteristics. However, in the proposed structure according to the present invention, the semiconductor layer interfaces with the low-K dielectric layer. Therefore, the interface properties of the dual structure are the same as the state-of-the-art single-dielectric structure.

The dielectric layer pinholes in prior art OFET structures are addressed through the addition of a high-K dielectric layer to eliminate the effects of shorts in the dielectric layer. In the claimed structure, the original dielectric layer is maintained such that the semiconductor/dielectric interface remains unchanged. The high-K dielectric layer contributes material to the gate dielectric to plug up pinholes in the original dielectric, but does not contribute significant capacitance due to the high dielectric constant of the additional dielectric layer. Thereby, the incidence of pinholes in the dielectric layer is reduced without significantly affecting the performance of the OFET transistor.

In a first embodiment of the invention, a top gate OFET having a dual dielectric layer includes a patterned first conductive layer on an insulating substrate forming source and drain contacts, a semiconductor layer in a channel region between the source and drain contacts, a first dielectric layer over the semiconductor layer in at least the channel region as well as any unconnected first level metal areas, a second dielectric layer over the first dielectric layer in at least the channel region as well as any unconnected first level metal areas, and a patterned second conductive layer on the second dielectric layer over the channel region, wherein the second dielectric layer has a dielectric constant higher than that of the first dielectric layer.

In a second embodiment of the invention, a bottom-gate/bottom-contact OFET structure having a dual dielectric layer includes a patterned first conductive layer on an insulating substrate, a first dielectric layer over the patterned first conductive layer, a second dielectric layer over the first dielectric layer, a patterned second conductive layer on the second dielectric layer forming source and drain contacts, and an organic semiconductor layer in a channel region between the source and drain contacts, wherein the second dielectric layer has a dielectric constant higher than that of the first dielectric layer.

In a third embodiment of the invention, a bottom-gate/bottom-contact OFET structure having a dual dielectric layer includes a patterned first conductive layer on an insulating substrate, a first dielectric layer over the patterned first conductive layer, a second dielectric layer over the first dielectric layer, an organic semiconductor layer over the second dielectric layer, and a patterned second conductive layer on organic semiconductor layer forming source and drain contacts, wherein the second dielectric layer has a dielectric constant higher than that of the first dielectric layer.

In the embodiments of the present invention, the insulating substrate includes PET, PEN, glass, or Kapton. The first conductive layer includes conductive organic materials such as PEDOT and carbon black, or nano-particle solutions or precursors of inorganic materials such as gold, silver, titanium, aluminum, or silicon. The semiconductor layer includes an organic semiconductor such as polythiophene or solution-based pentacene, or a solution-based inorganic semiconductor in the form of a precursor solution or suspended nanoparticles such as silicon or gallium arsenide. The first dielectric layer includes organic materials such as polyvinylphenol PVP and derivatives PNP-CPC and PVP-CL, poly(3,4-ethylenedioythiophene), PVA, or CYPEL. Ideally, the first dielectric layer has a dielectric constant less than four. The second dielectric layer includes ferroelectric polymers, or silicon nitride or inorganic materials in the form of a precursor solution or suspended nanoparticles such as silicon dioxide, titanium dioxide, or aluminum oxide. Ideally, the second dielectric layer has a dielectric constant greater than four. The second conductive layer includes nano-particle silver, a conductive polymer, flake-based silver inks, gold, zinc, or aluminum nanoparticles.

The process sequence for a top gate OFET structure having a dual dielectric layer according to the present invention is shown in FIGS. 1-6.

In FIG. 1 the source and drain of the OFET is deposited. A first conductor layer is deposited and patterned on insulating substrate 112 to form source 118 and drain 116. The patterned conductor layer can be formed conductive organic materials such as PEDOT and carbon black, or nano-particle solutions or pre-cursors of inorganic materials such as gold, silver, titanium, aluminum, or silicon.

Figure 2:
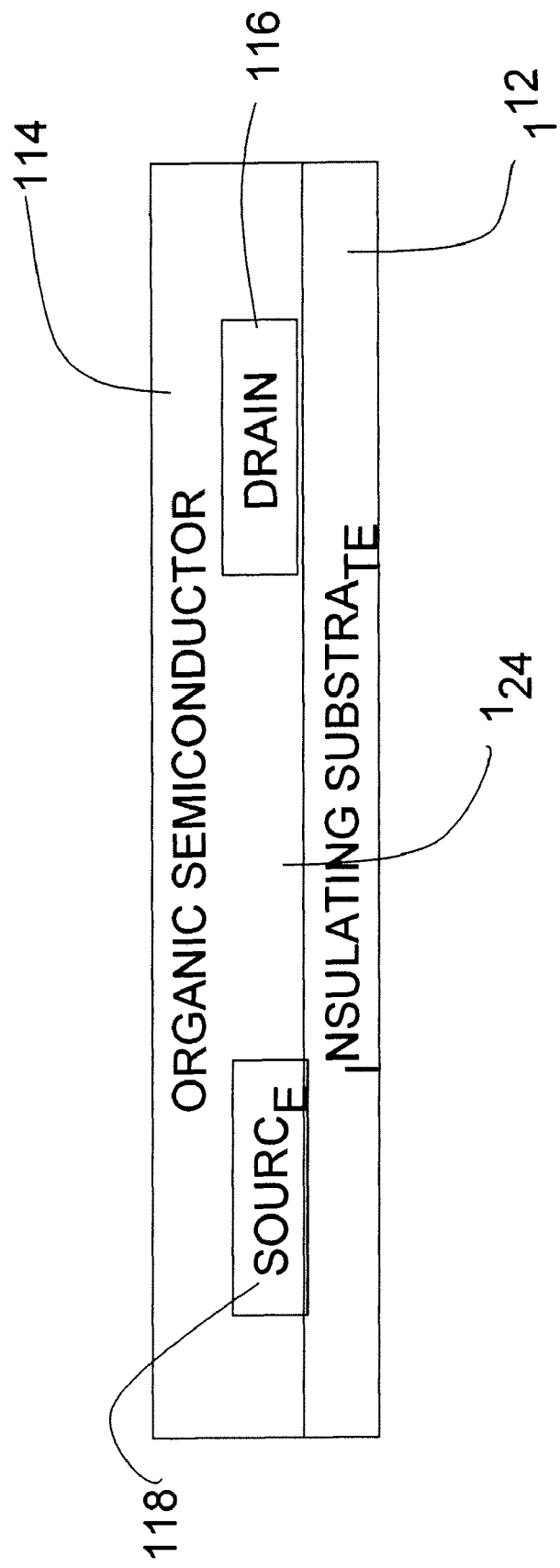

In FIG. 2, the semiconductor layer 114 is deposited in the channel region 124 between source 118 and drain 116, and overlaps at least in part source 118 and drain 116. The semiconductor layer 114 is deposited and patterned such that at minimum the semiconductor exists between the source 118 and drain 116 in the channel region 124. The semiconductor layer is formed by an organic semiconductor such as polythiophene or solution-based pentacene, or a solution-based inorganic semiconductor in the form of a precursor solution or suspended nanoparticles such as silicon or gallium arsenide.

Figure 3:
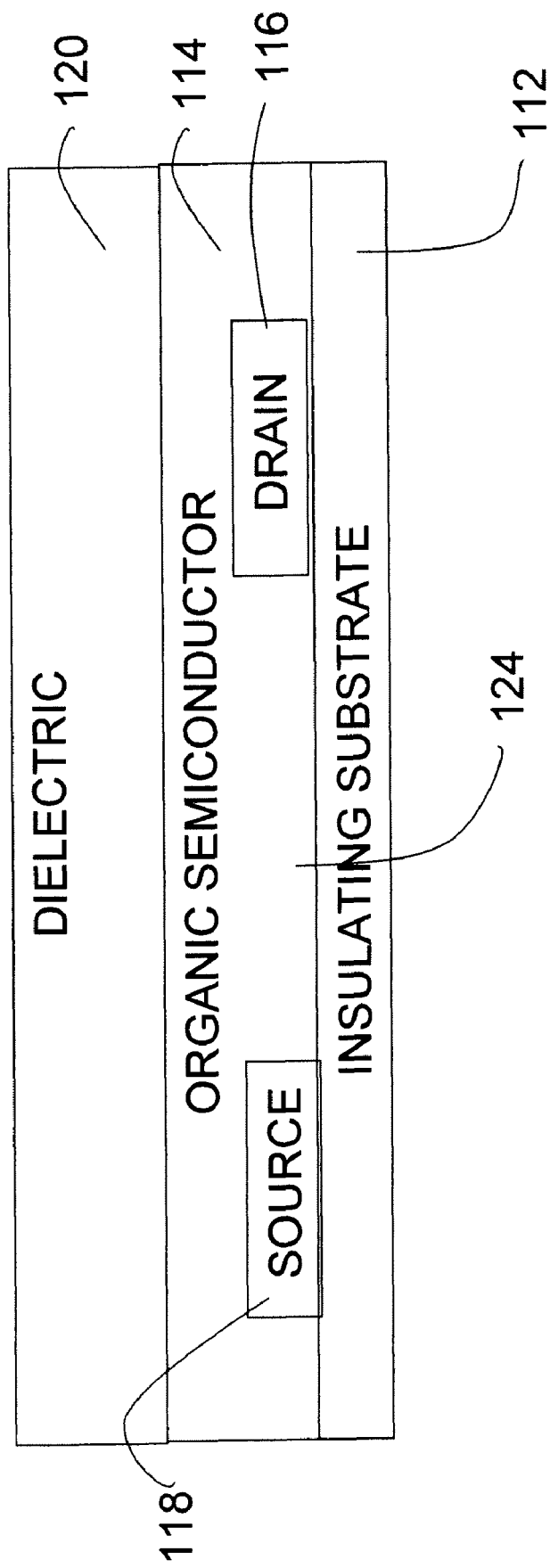

In FIG. 3, a low-K dielectric layer 120 is deposited over the organic semiconductor layer 114. At a minimum, the low-K dielectric layer 120 should cover the channel region 124 of the OFET (region between source 118 and drain 116), and must cover all areas on the first conductor layer (the layer used to form source 118 and drain 116) that are not to be connected to a subsequently formed second conductor layer. Low-K dielectric layer 120 is formed by polyvinylphenol PVP and derivatives PNP-CPC and PVP-CL, poly(3,4-ethylenedioythiophene), PVA, or CYPEL.

Figure 4:
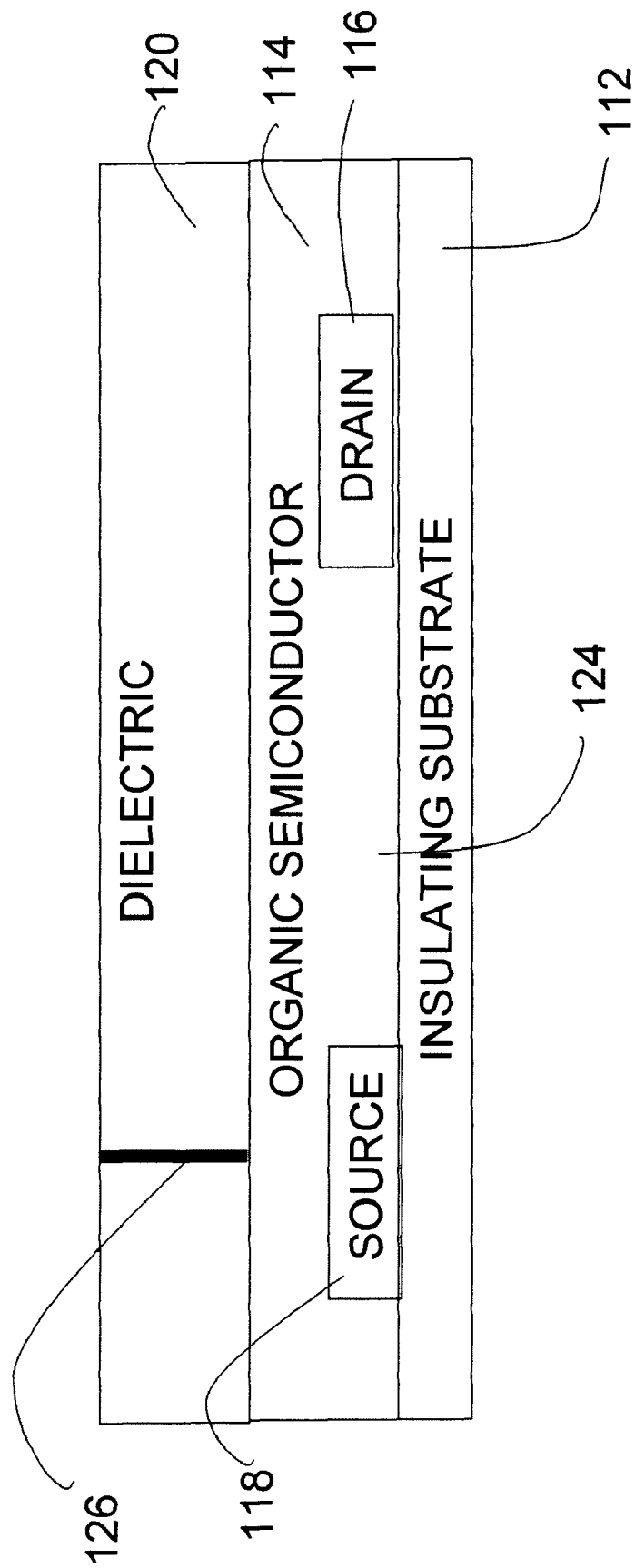

In FIG. 4, a pinhole 126 in the low-K dielectric layer 120 is shown. Such pinholes as pinhole 126 could result from air in the ink during agitation, or perhaps because the ink was not properly outgassed before printing. Pinholes could also result due to an imperfection in the underlying layer causing wetting issues of the dielectric ink, leaving an opening. The pinhole could also occur during an anneal or drying process as the solvent is evaporating. Alternatively, such a pinhole 126 could result from particles in the ink or on the deposition surface. The pinhole 126 could go through only the dielectric layer 120 as shown in FIG. 4, and contact the semiconductor layer 114. Alternatively, the pinhole 126 could line up with another pinhole in the semiconductor layer 114 (second pinhole not shown in FIG. 4), shorting the two metal layers (specifically, the source as shown in FIG. 4 to the second metal layer, not yet formed in FIG. 4) together.

Figure 5:
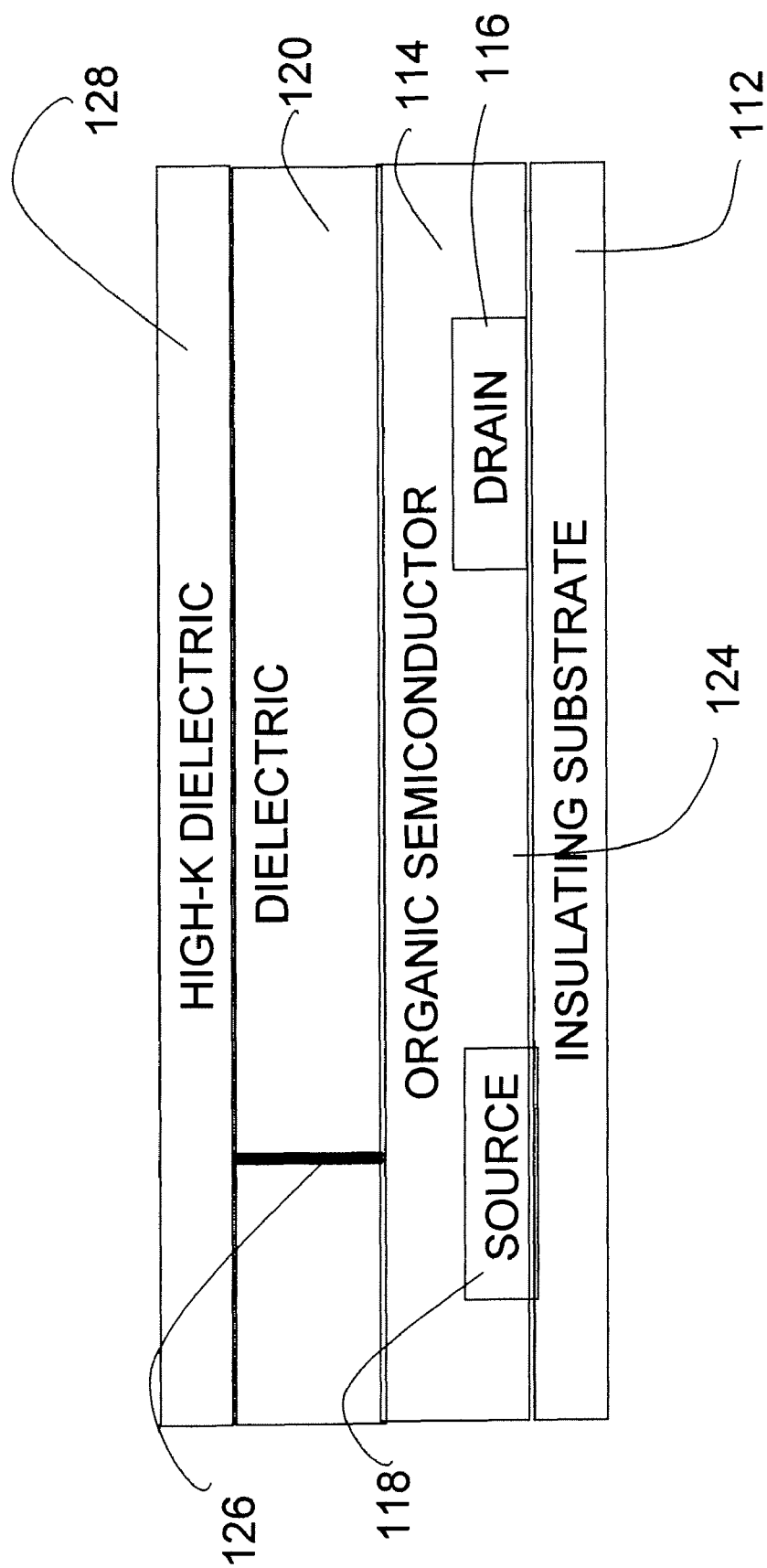

In FIG. 5, the high-K dielectric 128 is deposited and patterned on the surface of the low-K dielectric layer 120. The high-K dielectric layer 128 is used to plug any pinholes 126 that may exist in the underlying dielectric layer 120 and/or semiconductor layer 114. As previously noted, the high-K dielectric layer 128 could be a ferroelectric polymer. The high-K dielectric layer 128 is formed by ferroelectric polymers, or silicon nitride or inorganic materials in the form of a precursor solution or suspended nanoparticles such as silicon dioxide, titanium dioxide, or aluminum oxide.

Figure 6:
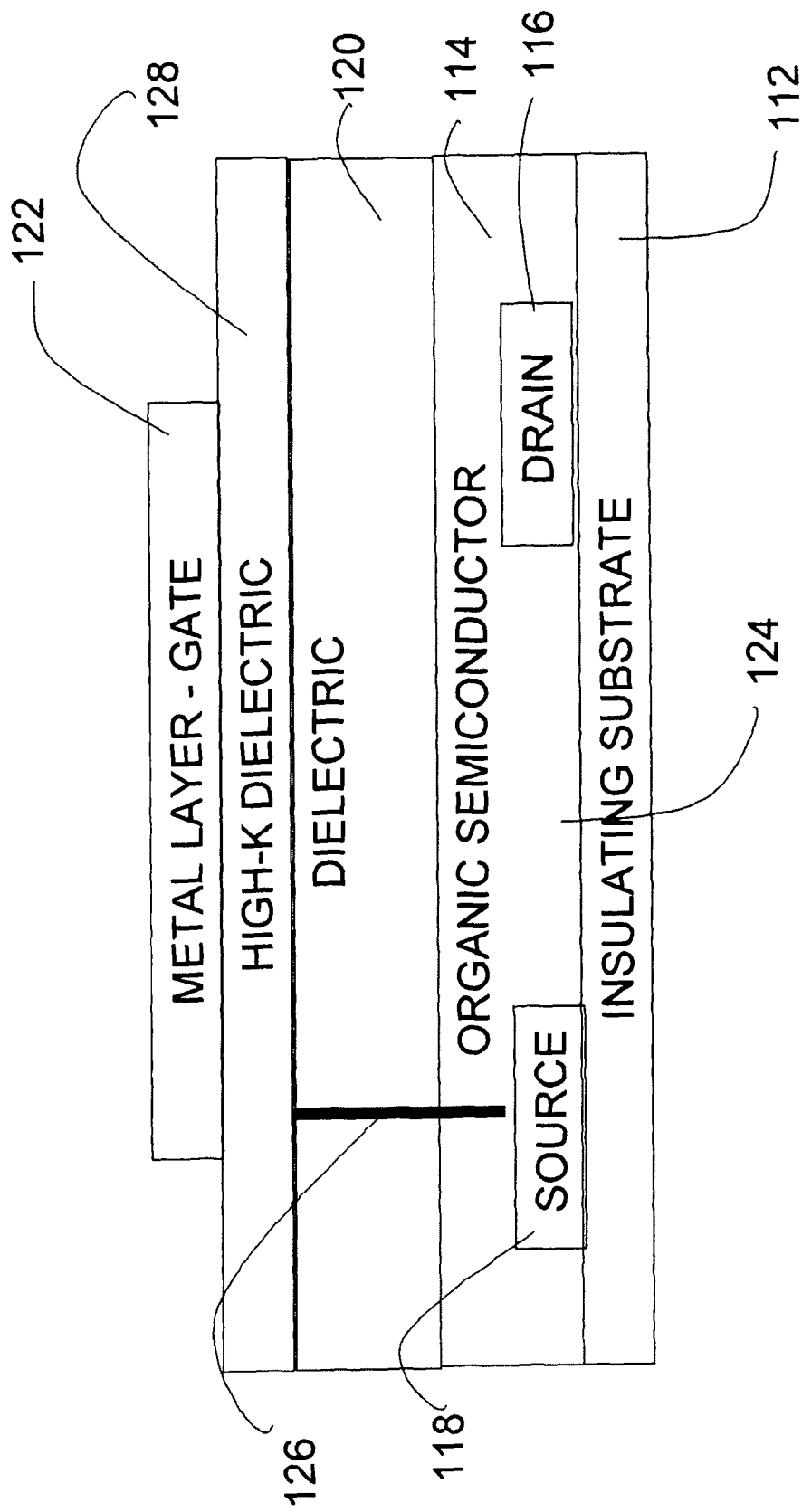

In FIG. 6, a second metal layer 122 is deposited and patterned to form the gate conductor 122. The gate conductor 122 ideally resides over the channel region 124 of the OFET (between the source 118 and drain 116). The gate conductor may overlap the source and drain.

FIGS. 1-6 complete the process flow of the dual high-K/low-K dielectric top gate process to form an OFET according to a first embodiment of the present invention. The dual high-K/low-K dielectric layer structure can also be inserted into other OFET transistor structures according to the present invention. The final result of these other structure options are illustrated in a cross-sectional diagram in FIGS. 7 and 8, although the individual process steps are not. The materials and methods described above and shown in FIGS. 1-6 for forming the individual layers can be reused for the OFETs shown in FIGS. 7 and 8. With respect to FIGS. 1-8, patterning of various layers can be achieved additively by depositing solution-based inks using print techniques such as inkjet, gravure, flexography, screen printing, letter press, or off-set lithography. Alternatively, an unpatterned solid layer can be deposited followed by a subtractive step such as a photo-defined resist pattern, followed by an etch of the material or by dry removal techniques such as laser ablation.

In FIG. 7, a bottom gate/bottom contact OFET structure 700 with a high-K dielectric layer according to the present invention is shown. OFET 700 includes an insulating substrate layer 702, a first patterned metal layer 704 forming the gate of the OFET, a low-K dielectric layer 706 covering the metal gate layer 704, a high-K dielectric layer 708 formed over the low-K dielectric layer 706, a second patterned metal layer forming the source 710 and drain 712 of the OFET, and an organic semiconductor layer 714 formed over the source 710 and drain 712.

In FIG. 8, a bottom gate/top contact OFET structure 800 with a high-K dielectric layer according to the present invention is shown. OFET 800 includes an insulating substrate layer 802, a first patterned metal layer 804 forming the gate of the OFET, a low-K dielectric layer 806 covering the metal gate layer 804, a high-K dielectric layer 808 formed over the low-K dielectric layer 806, an organic semiconductor layer 814 formed over high-K dielectric layer 808, and a second patterned metal layer forming the source 810 and drain 812 of the OFET.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. We therefore claim all modifications and variations coming within the spirit and scope of the following claims.

I claim:

1. A method of fabricating an OFET having a dual dielectric layer comprising:
    providing a patterned first conductive layer on an insulating substrate to form a gate electrode;
    providing a first dielectric layer over the gate electrode, wherein the first dielectric layer has one or more pinholes;
    providing a second dielectric layer over the first dielectric layer, wherein the second dielectric layer has a dielectric constant higher than the first dielectric layer dielectric constant, and wherein the second dielectric layer fills the one or more pinholes in the first dielectric layer;
    providing a semiconductor layer over the second dielectric layer; and
    providing a patterned second conductive layer to form source and drain contacts and a channel region therebetween in the semiconductor layer.

2. The method of claim 1 wherein the insulating substrate is selected from the group consisting of PET, PEN, glass, and Kapton.

3. The method of claim 1 wherein the first conductive layer is selected from the group consisting of PEDOT, carbon black, nano-particle solutions of inorganic materials, and precursors of inorganic materials.

4. The method of claim 1 wherein the semiconductor layer comprises an organic semiconductor selected from the group consisting of polythiophene, solution-based pentacene, a solution-based inorganic semiconductor in the form of a precursor solution, and a solution-based inorganic semiconductor in the form of suspended nanoparticles.

5. The method of claim 1 wherein the first dielectric layer comprises organic materials selected from the group consisting of polyvinylphenol and derivatives, poly(3,4-ethylenedioythiophene), PVA, and CYPEL.

6. The method of claim 1 wherein the first dielectric layer dielectric constant is less than four.

7. The method of claim 1 wherein the second dielectric layer comprises an organic ferroelectric polymer.

8. The method of claim 1 wherein the second dielectric layer dielectric constant is greater than four.

9. The method of claim 1 wherein the second conductive layer is selected from the group consisting of nano-particle silver, a conductive polymer, flake-based silver inks, gold, zinc, and aluminum nanoparticles.

10. The method of claim 1 wherein the first dielectric layer is thicker than the second dielectric layer.

* * * * *